(12) United States Patent
Takeuchi et al.

(10) Patent No.: US 9,583,188 B2
(45) Date of Patent: Feb. 28, 2017

(54) SEMICONDUCTOR MEMORY DEVICE INCLUDING REWRITING OPERATION FOR IMPROVING THE LONG-TERM RELIABILITY OF THE RESISTANCE VARIABLE ELEMENT

(71) Applicant: Renesas Electronics Corporation, Tokyo (JP)

(72) Inventors: Kiyoshi Takeuchi, Tokyo (JP); Akira Tanabe, Tokyo (JP); Kenzo Manabe, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/945,321

(22) Filed: Nov. 18, 2015

(65) Prior Publication Data

US 2016/0141030 A1    May 19, 2016

(30) Foreign Application Priority Data

Nov. 19, 2014 (JP) ................................. 2014-234648

(51) Int. Cl.
*G11C 11/00* (2006.01)
*G11C 11/15* (2006.01)
*G11C 13/00* (2006.01)

(52) U.S. Cl.
CPC ...... *G11C 13/0069* (2013.01); *G11C 13/0007* (2013.01); *G11C 13/0035* (2013.01); *G11C 13/0061* (2013.01); *G11C 13/0064* (2013.01); *G11C 13/004* (2013.01); *G11C 2013/0073* (2013.01); *G11C 2013/0076* (2013.01); *G11C 2013/0092* (2013.01); *G11C 2213/79* (2013.01); *G11C 2213/82* (2013.01)

(58) Field of Classification Search
USPC ......................................... 365/148, 163, 175
See application file for complete search history.

(56) References Cited

U.S. PATENT DOCUMENTS 8,593,853 B2    11/2013  Katoh
8,693,234 B2 *   4/2014  Honda ............... G11C 13/0004
                                                 365/148

(Continued)

FOREIGN PATENT DOCUMENTS

JP    4838399 B2   12/2011
JP    5307213 B2   10/2013

*Primary Examiner* — Trong Phan
(74) *Attorney, Agent, or Firm* — McDermott Will & Emery LLP

(57) ABSTRACT

A semiconductor memory device has at least one memory cell using a resistance variable element, and a control circuit which controls writing to and reading from the memory cell. Operations by the control circuit include a first writing operation, a second writing operation, and a rewriting operation. The first writing operation is a writing operation for applying a first voltage of a first polarity to the memory cell. The second writing operation is a writing operation for applying a second voltage of a second polarity opposite to the first polarity to the memory cell. The rewriting operation is a writing operation for, when the first writing operation fails, further executing a second A writing operation for applying the second voltage of the second polarity to the memory cell and a first A writing operation for applying the first voltage of the first polarity to the memory cell.

15 Claims, 16 Drawing Sheets

(56) References Cited

U.S. PATENT DOCUMENTS 9,001,551 B2 * 4/2015 Chang ................ G11C 13/0007
365/148
9,019,755 B2 * 4/2015 Otsuka ................ B65D 71/125
365/148
9,378,817 B2 * 6/2016 Kawai ................ G11C 13/0069

* cited by examiner

SEMICONDUCTOR MEMORY DEVICE INCLUDING REWRITING OPERATION FOR IMPROVING THE LONG-TERM RELIABILITY OF THE RESISTANCE VARIABLE ELEMENT

CROSS-REFERENCE TO RELATED APPLICATIONS

The disclosure of Japanese Patent Application No. 2014-234648 filed on Nov. 19, 2014 including the specification, drawings and abstract is incorporated herein by reference in its entirety.

BACKGROUND

The present invention relates to a semiconductor memory device, and particularly to a semiconductor memory device using resistance variable elements.

In writing of a nonvolatile memory like a flash memory or a ReRAM (Resistive RAM), confirmation is made as to whether data has been properly written after writing of the data, and a Verify operation for performing each of additional writing operations is carried out when the data is not properly written. As the additional writing operations, normally, the operation of writing 0 is executed when it is desired to write 0, and the operation of writing 1 is executed when it is desired to write 1.

There has been described in, for example, each of Patent Document 1 and Patent Document 2, a method in which in a bipolar type ReRAM using resistance variable elements, a 0-oriented pulse of a lower voltage than usual is first applied when 1 is failed to be written, and thereafter a 1-oriented pulse is applied (second to third steps in FIG. 11, for example) to thereby perform rewriting.

RELATED ART DOCUMENTS

Patent Documents

[Patent Document 1] Japanese Patent No. 4838399
[Patent Document 2] Japanese Patent No. 5307213

SUMMARY

In the bipolar type ReRAM (in which the polarity of a voltage applied to the resistance variable element is reversed where the resistance variable element is switched to a high resistance and switched to a low resistance), fatigue of the resistance variable element is promoted when the voltage of the same polarity continues to be applied to the resistance variable element sequentially, so that reliability is deteriorated. In the method described in each of Patent Document 1 and Patent Document 2 mentioned above, the application of an inverse pulse is considered to bring about the effect of reducing fatigue, but the effect is not sufficient because the voltage of the pulse to be applied is low. It is therefore necessary to improve the long-term reliability of the resistance variable element.

Other problems and novel features will be apparent from the description of the present specification and the accompanying drawings.

A semiconductor memory device according to one aspect of the present invention includes at least one memory cell using a resistance variable element, and a control circuit which controls writing to and reading from the memory cell. Operations by the control circuit include a first writing operation, a second writing operation, and a rewriting operation. The first writing operation is a writing operation for applying a first voltage of a first polarity to the memory cell. The second writing operation is a writing operation for applying a second voltage of a second polarity opposite to the first polarity to the memory cell. The rewriting operation is a writing operation for, when the first writing operation fails, further executing a second A writing operation for applying the second voltage of the second polarity to the memory cell and a first A writing operation for applying the first voltage of the first polarity to the memory cell.

More preferably, in the semiconductor memory device, the second A writing operation which belongs to the rewriting operation applies a pulse having the same magnitude as in the second writing operation.

According to one aspect of the present invention, it is possible to improve the long-term reliability of the resistance variable element.

DETAILED DESCRIPTION

Figure 1:
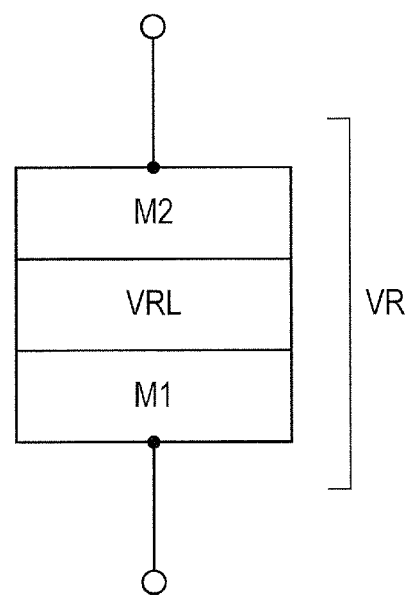
FIG. 1 is a diagram showing one example of a structure of a resistance variable element used in a semiconductor memory device according to an embodiment 1 of the present invention.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that in the following embodiments, components (also including element or factor steps, etc.) employed therein are not always essential except for where otherwise specified in particular and considered to be definitely essential in principle, etc.

Similarly, when reference is made to the shapes, positional relations and the like of the components or the like in the following embodiments, they will include ones substantially analogous or similar to their shapes or the like except for where otherwise specified in particular and considered not to be definitely so in principle, etc. This is similarly applied even to the above-described numerical values and range.

SUMMARY OF EMBODIMENT

A summary of an embodiment will first be described. In the summary of the present embodiment, the present embodiment will be described by way of example with reference numerals or the like of corresponding components of the embodiment being attached in parentheses.

A semiconductor memory device according to one embodiment has at least one memory cell (MC) using a resistance variable element (VR), and a control circuit (WLCTL, BLCTL, PLCTL) which controls writing to and reading from the memory cell. Operations to be done by the control circuit include a first writing operation (bipolar-type On (or Off) writing operation), a second writing operation (bipolar type Off (or On) writing operation), and a rewriting operation. The first writing operation is a writing operation for applying a first voltage of a first polarity to the memory cell. The second writing operation is a writing operation for applying a second voltage of a second polarity being a polarity opposite to the first polarity to the memory cell. The rewriting operation is a writing operation for, when the first writing operation fails, further executing a second A writing operation (reset Off (or On) writing operation) for applying the second voltage of the second polarity to the memory cell and a first A writing operation (original On (or Off) writing operation) for applying the first voltage of the first polarity to the memory cell.

More preferably, in the semiconductor memory device, the second A writing operation which belongs to the rewriting operation is done to apply a pulse of the same magnitude as in the second writing operation.

Each embodiment based on the summary of the above-described embodiment will hereinafter be described in detail on the basis of the accompanying drawings. Incidentally, the same reference numerals or related reference numerals are respectively attached to the same members in principle in all the drawings for describing the embodiments, and a repeated description thereof will be omitted.

Embodiment 1

A semiconductor memory device according to the present embodiment 1 will be described using FIGS. 1 to 8.

The semiconductor memory device according to the present embodiment 1 is a bipolar type ReRAM and is a memory unit in which the polarity of a voltage applied to one of resistance variable elements is made inverse where the resistance variable element is switched to a high resistance and switched to a low resistance. In the bipolar type ReRAM, when writing in one direction is continued, the deviation of an oxygen distribution in a resistance variable layer occurs, and the characteristics of the resistance variable element fluctuate. Therefore, in each resistance variable element, the number of times of On (reduction in resistance) writing and the number of times of Off (increase in resistance) writing are required to be brought to a state of being always substantially equal to each other.

Further, it has become clear in the evaluation of the ReRAM that even if the resistance value of the resistance variable element is written under entirely the same condition, the post-writing resistance value greatly fluctuates every time, and the degree of fluctuations in the resistance value falls above fluctuations between the resistance variable elements. This property is different from that of the related art nonvolatile memory element, and a novel writing method adapted to the fluctuations is required.

Thus, in the present embodiment, during verify, the writing of data in a reverse direction is first performed on a bit at which a failure in writing has been confirmed, and the writing of original data is next performed. Thus, in each resistance variable element, the deviation of the oxygen distribution is prevented by setting the number of times of the On (reduction in resistance) writing and the number of times of the Off (increase in resistance) writing to the state of being always nearly equal to each other, whereby the long-term reliability of the resistance variable element is improved.

<Resistance Variable Element>

A description will first be made about the resistance variable element used in the bipolar type ReRAM according to the present embodiment 1 with reference to FIG. 1. FIG. 1 is a diagram showing one example of the structure of this resistance variable element.

In the resistance variable element VR, a resistance variable layer VRL is interposed by a metal layer M1 and a metal layer M2. The metal layer M1 and the metal layer M2 respectively form a first electrode and a second electrode. The resistance variable layer VRL can be changed to a low resistance (On) state by applying a positive voltage to the metal layer M2 on the basis of the metal layer M1, and changed to a high resistance (Off) state by applying a positive voltage to the metal layer M1 on the basis of the metal layer M2, respectively. 1-bit information is stored by allowing the On and Off states to correspond to 0 and 1 or 1 and 0, respectively.

The resistance variable layer VRL is formed of, for example, metal oxide (e.g., tantalum oxide, titanium oxide, zirconium oxide, or hafnium oxide). In this case, the resistance variable layer VRL may be a single layer film or a laminated film. When the resistance variable layer VRL is of the laminated layer, the resistance variable layer VRL is, for example, a laminated layer in which the combinations of kinds of elements are different from each other. Alternatively, the resistance variable layer VRL may be, for example, a laminated film in which the combinations of kinds of elements are identical to each other. In this case, the respective layers of the laminated film differ from each other in oxygen composition ratio. Incidentally, the thickness of the resistance variable layer VRL is greater than or equal to 1.5 nm and less than or equal to 30 nm, for example. The metal layer M1 is formed of, for example, ruthenium, titanium nitride, tantalum, tantalum nitride, tungsten, palladium, or platinum. The metal layer M2 is formed of, for example, ruthenium, titanium nitride, tantalum, tantalum nitride, tungsten, palladium, or platinum.

<Memory Cell>

Figure 2:
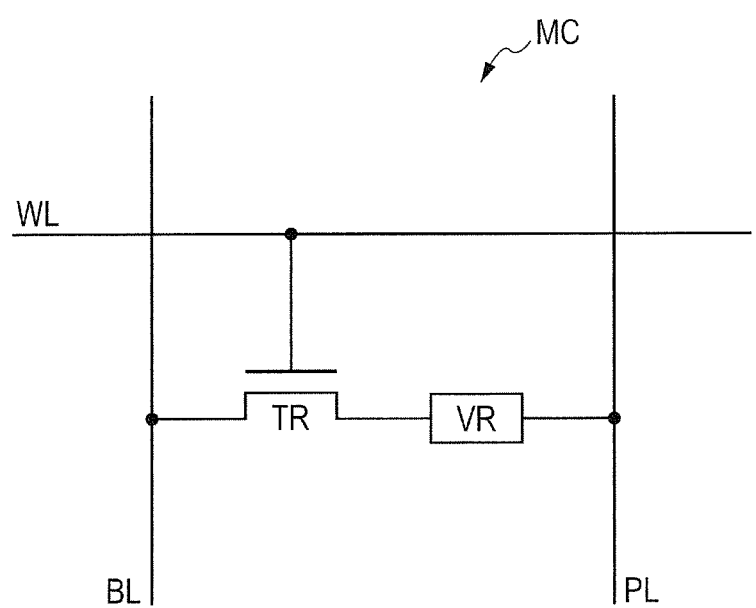
FIG. 2 is a diagram showing one example of a configuration of a memory cell including the resistance variable element shown in FIG. 1 in the semiconductor memory device according to the embodiment 1 of the present invention.

A memory cell including the above-described resistance variable element VR will be described with reference to FIG. 2. FIG. 2 is a diagram showing one example of the configuration of the memory cell.

The memory cell MC can be configured by combining the resistance variable element VR shown in FIG. 1 and a MOS transistor TR. The MOS transistor TR is a selection transistor which controls whether to apply a difference in potential between a bit line BL and a plate line PL to the resistance variable element VR or cut off the potential difference. One terminal of the resistance variable element VR is coupled to the plate line PL, and the other terminal thereof is coupled to the bit line BL via the MOS transistor TR, respectively. Further, the gate of the MOS transistor TR is coupled to a word line WL. The polarity of the voltage applied to the resistance variable element VR can be switched depending on whether to set either of the potential of the bit line BL and the potential of the plate line PL to a potential higher than others. Although no particular limitation is imposed on whether to couple either of the metal layer M1 and the metal layer M2 to the plate line PL, the following description will be made assuming that the metal layer M2 is being coupled to the plate line PL. Further, although the MOS transistor TR is not limited to an N channel type or a P channel type, the following description will be made assuming that the MOS transistor TR is of the N channel type of which the source and drain are made conductive by applying a positive voltage to its gate. Incidentally, in the case of the P channel type, its source and drain are made conductive to each other by applying a negative voltage to the gate thereof.

<Memory Cell Array>

Figure 3:
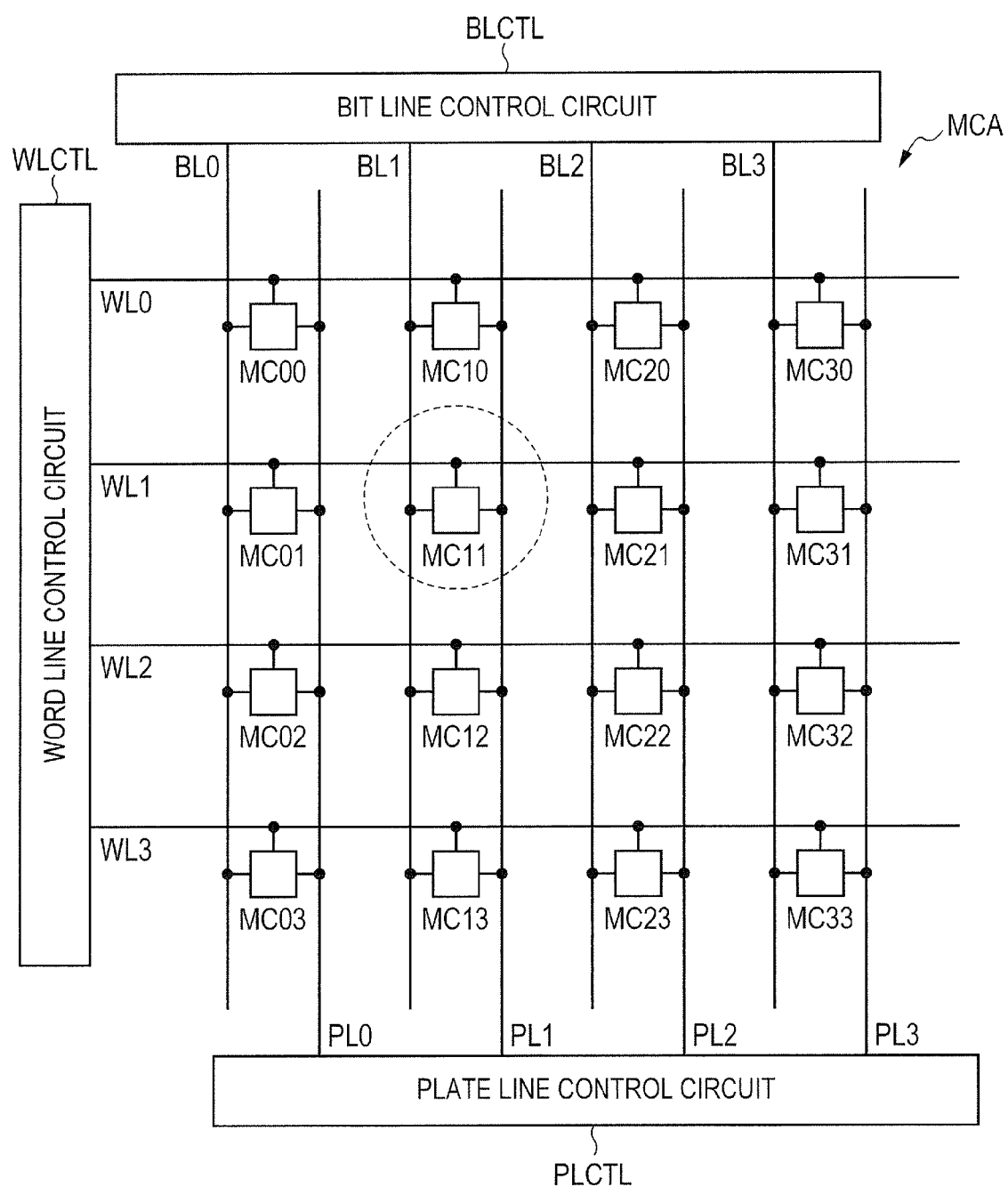
FIG. 3 is a diagram showing one example of a configuration of a memory cell array in which the memory cells each shown in FIG. 2 are arranged in the semiconductor memory device according to the embodiment 1 of the present invention.

A memory cell array in which the above-described memory cells MC are arranged will be described with reference to FIG. 3. FIG. 3 is a diagram showing one example of the configuration of the memory cell array.

The memory cell array MCA can be configured by arranging the memory cells MC each shown in FIG. 2 in a matrix form as shown in FIG. 3. In FIG. 3, each quadrangle corresponds to the memory cell MC shown in FIG. 2. Although FIG. 3 shows the memory cell array MCA (4 rows×4 columns, memory cells MC00 to MCO3, MC10 to MC13, MC20 to MC23, and MC30 to MC33) having a storage capacity of 16 bits, a larger capacity can be appropriately realized if the array is increased in row and column.

The memory cells MC00 to MC03, MC10 to MC13, MC20 to MC23, and MC30 to MC33 in the memory cell array MCA are respectively coupled to intersection points between word lines WL0 to WL3, bit lines BL0 to BL3, and plate lines PL0 to PL3. For example, the memory cell MC00 is coupled to the intersection point between the word line WL0, the bit line BL0 and the plate line PL0. Other memory cells MC01 to MC03, MC10 to MC13, MC20 to MC23, and MC30 to MC33 other than the memory cells MC00 are also respectively coupled to intersection points between the word lines, bit lines and plate lines in like manner.

In the memory cell array MCA, all plate lines PL0 to PL3, bit lines B0 to BL3, and word lines WL0 to WL3 are coupled to control circuits provided at the peripheral parts of the array. For example, the bit lines BL0 to BL3 are coupled to a bit line control circuit BLCTL above the array, the plate lines PL0 to PL3 are coupled to a plate line control circuit PLCTL below the array, and the word lines WL0 to WL3 are coupled to a word line control circuit WLCTL at the left hand of the array, respectively. The control circuits perform writing by appropriately applying voltages to the plate line, the bit line, and the word line to thereby bring a desired memory cell to a high resistance state or a low resistance state or perform reading by detecting a current flowing through the bit line or the plate line to thereby determine whether a desired memory cell is high or low in resistance.

For example, in the case of writing at which the memory cell MC11 surrounded by a dotted line is brought to an On state, the plate line PL1 and the word line WL1 are respectively set to a high potential, and all bit lines BL0 to BL3 and the plate lines PL0, PL2 and PL3 and the word lines WL0, WL2 and WL3 other than the plate line PL1 and the word line WL1 may respectively be set to a zero potential. In the case of writing at which the memory cell MC11 surrounded by the dotted line is brought to an Off state, the bit line BL1 and the word line WL1 are respectively set to a high potential, and all plate lines PL0 to PL3, and the bit lines BL0, BL2 and BL3 and the word lines WL0, W2 and WL3 other than the bit line BL1 and the word line WL1 may respectively be set to zero potential. Further, in order to perform reading as to whether the memory cell MC11 surrounded by the dotted line is in the On or Off state, it is carried out as follows: The word line WL1 is set to a high potential. All other bit lines BL0 to BL3, and the plate lines PL0, PL2 and PL3 and the word lines WL0, WL2 and WL3 other than the plate line PL1 and the word line WL1 are respectively set to the zero potential. A voltage sufficiently lower than at writing may be applied to the plate line PL1 to detect a current flowing through the plate line PL1 or the bit line BL1.

In the above operation, the transistors are brought into non-conduction in the memory cells coupled to those other than the word line WL1, so that no voltage is applied to the resistance variable elements. Further, in the memory cells not coupled to the bit line BL1 and the plate line PL1, no voltage is applied to the resistance variable elements because the bit lines BL0, BL2 and BL3 and the plate lines PL0, PL2 and PL3 become the same potential. Thus, only the memory cell MC11 surrounded by the dotted line written and read. The writing to or reading from other memory cells MC00 to MC03, MC10, MC12, MC13, MC20 to MC23, and MC30 to MC33 other than the memory cell MC11 is also similar to the above.

<Writing Operation, Reading Operation, Verify Operation>

A writing operation, a reading operation, and a verify operation for the above-described memory cell MC will be described with reference to FIGS. 4 to 7.

The ReRAM has the property that the resistance value of the resistance variable element VR after execution of the writing fluctuates every time. Therefore, even if the writing is performed under fixed conditions, the writing may fail with a certain probability. That is, there is a case where even if On was intended to be written, the resistance value is not sufficiently lowered, or even if Off was intended to be written, the resistance value is not sufficiently increased. Even in such a case, the verify operation can be executed to perform writing without fail.

Figure 4:
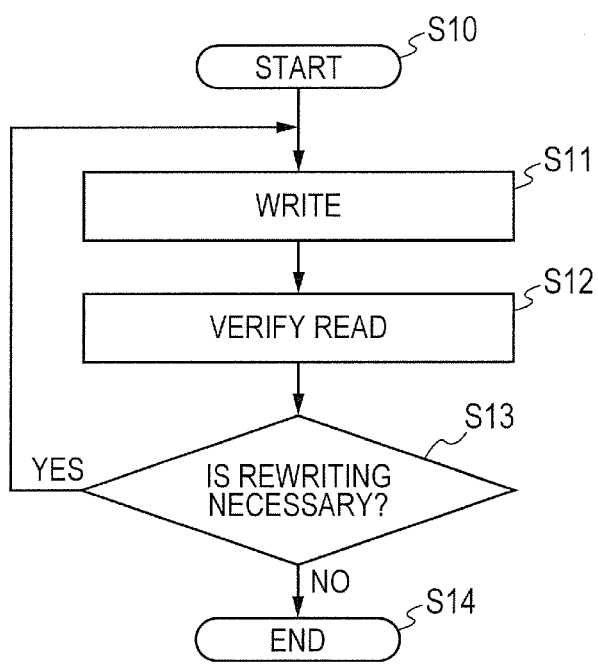
FIG. 4 is a flowchart showing one example of the flow of a writing operation including a verify operation in the semiconductor memory device according to the embodiment 1 of the present invention.

FIG. 4 is a flowchart showing one example of the flow of a writing operation including a general verify operation (applicable even in the present embodiment). First, in Step S11 after starting the writing operation (Step S10), On or Off writing is performed on a certain memory cell. Next, in Step S12, it is checked whether the writing can be properly performed by executing reading of the memory cell. If the writing is found to be unable to be done properly, it is determined that rewriting is necessary (Step S13—YES). Referring back to Step S11 from Step S13, the same writing is performed again. If the writing is found to be able to be done properly (Step S13—No), then the writing operation is ended (Step S14). Incidentally, in order to prevent falling into an endless loop, an upper limit is normally placed on the number of times that the YES determination is performed in Step S13.

It is desirable that upon performing writing to a desired memory cell, reading of the memory cell is performed in advance, and writing is carried out only when the state of its reading is reversed. For example, when it is desired to turn On a certain memory cell, writing of On is executed if the memory cell is Off at present, and not executed if the memory cell is On at present. This is because overwriting On on the resistance variable element VR placed in the On state or overwriting Off on the resistance variable element VR placed in the Off state leads to deterioration in reliability. The flow of a write operation when this method and the above verify are combined together is shown in FIG. 5.

Figure 5:
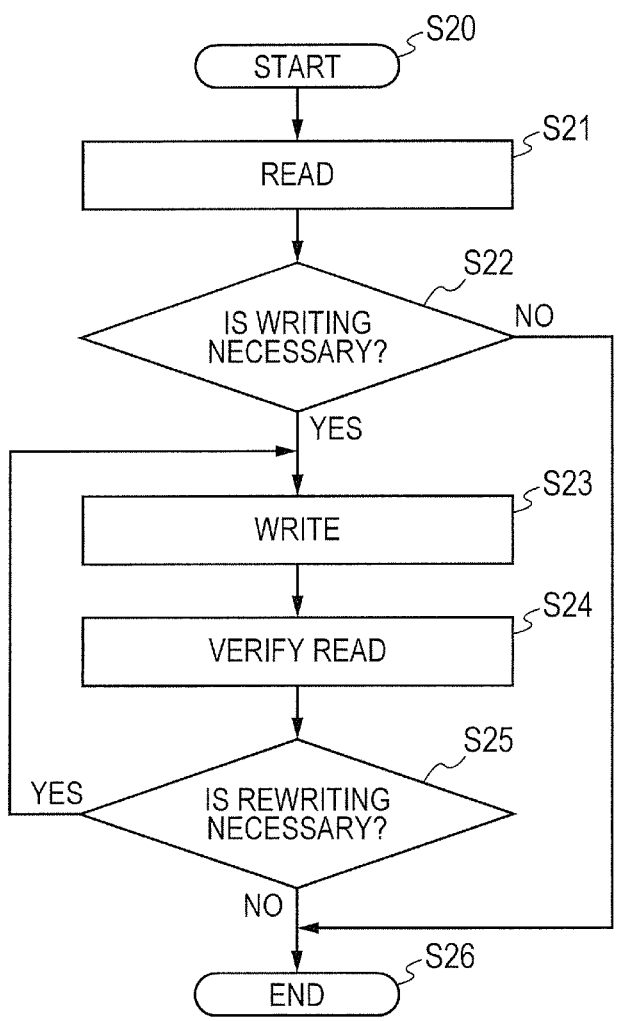
FIG. 5 is a flowchart showing one example of a flow when a writing operation including a verify operation is performed after making a determination as to whether or not to execute writing in advance in the semiconductor memory device according to the embodiment 1 of the present invention.

That is, FIG. 5 is a flowchart showing one example of the flow where a writing operation including a verify operation is performed after determination as to whether to execute writing in advance. In the example of FIG. 5, reading of a desired memory cell is performed in advance in Step S21 after starting the writing operation (Step S20). Next in Step S22, it is determined whether writing for inverting the state of the corresponding memory cell is required. If this writing is determined to be necessary (Step S22—YES), writing is performed on a desired memory cell in a manner similar to FIG. 4 in Steps S23 to S25. If the writing is determined not to be necessary (Step S22—No), the writing operation is ended (Step S26).

Figure 6A:
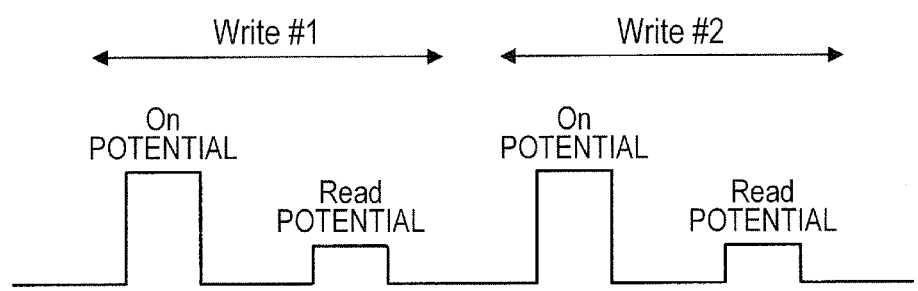
FIGS. 6A and 6B are diagrams respectively showing one example of the waveforms of a writing operation including a conventional verify operation with respect to the semiconductor memory device according to the embodiment 1 of the present invention.
Figure 6B:
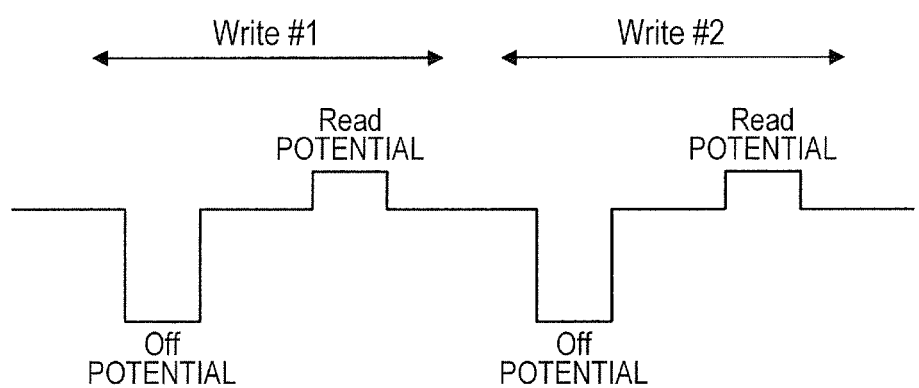

FIG. 6 is a diagram showing one example of the waveforms of a writing operation including a conventional verify operation. FIG. 6 shows time changes in voltage applied between the plate line PL and the bit line BL of the selected memory cell where the above-described operation of FIG. 4 or the operation subsequent to Step S23 in FIG. 5 is carried out. However, the terminal on the bit line BL side of each resistance variable element VR is set as a zero reference. FIG. 6A shows where On writing is performed, and FIG. 6B shows where Off writing is performed. Write #1 corresponds to the first writing and verify reading, and Write #2 corresponds to the next writing and verify reading. During at least part of a period during which an On potential, an Off potential, and a Read potential are applied, a positive potential is applied to the word line WL of the selected memory cell, and the transistor of the memory cell must be set to an on state. Thus, a pulse-shaped voltage (On pulse, Off pulse, Read pulse) lasting for a period during which a voltage is applied between the bit line BL and the plate line PL and a voltage is applied to the word line WL is applied to the resistance variable element VR of the selected memory cell, whereby writing or reading is executed.

Incidentally, the voltages of these pulses do not necessarily coincide with the On potential, Off potential and Read potential applied between the plate line PL and the bit line BL due to a voltage drop in the transistor. If the writing is succeeded at one time, the operation of Write #2 is not executed. When the writing fails during Write #2, an operation similar to that for Write #2 is repeated after Write #3 not shown in the drawing. Although the Read pulse is applied for the verify reading, the voltage thereof is suppressed sufficiently low to such a degree as not to affect the resistance variable element VR. The polarity of the Read potential may be the same as the On potential or may be reversed (FIG. 6 illustrates where it is the same as the On potential). The On potential and the Off potential may be equal to or different from each other in magnitude (FIG. 6 illustrates where they are equal to each other in magnitude).

Figure 7A:
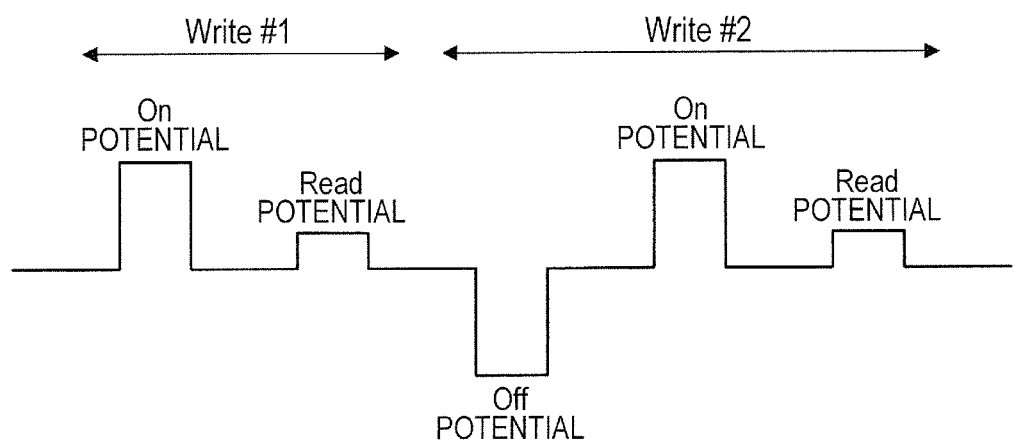
FIGS. 7A and 7B are diagrams respectively showing one example of the waveforms of the writing operation including the verify operation in the semiconductor memory device according to the embodiment 1 of the present invention.
Figure 7B:
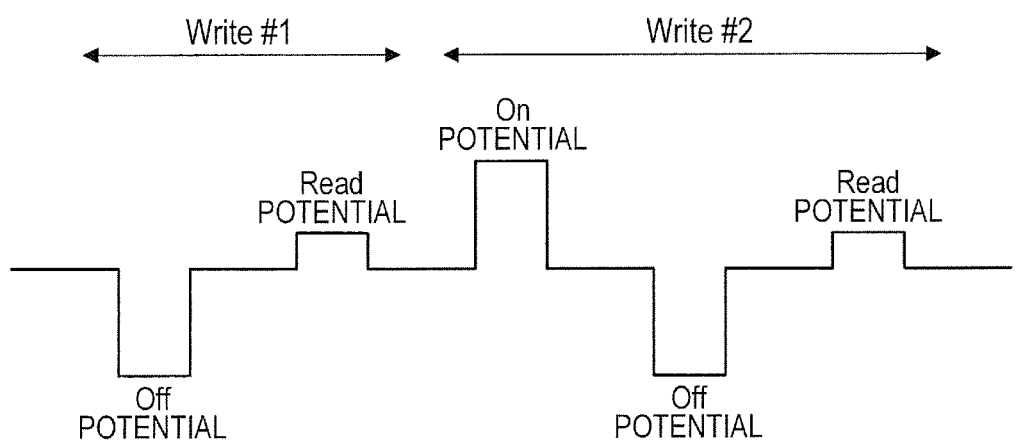

When the On or Off writing is simply repeated as shown in FIG. 6, the pulse of the same polarity is applied to the resistance variable element VR for each failure in writing, so that the fatigue of the resistance variable element VR is promoted and hence deterioration in reliability of the ReRAM becomes easy to be accumulated. A writing method for solving this problem is shown in FIG. 7. FIG. 7 is a diagram showing one example of the waveforms of a writing operation including a verify operation in the present embodiment. FIGS. 7A and 7B respectively correspond to FIGS. 6A and 6B. FIG. 7 is different from FIG. 6 in that pulses of polarity opposite to the last write polarity are added at rewriting Write #2 after a failure in writing. As shown in FIG. 7A, an On pulse is first applied after the application of an Off pulse where On is written. Further, as shown in FIG. 7B, an Off pulse is applied after the application of an On pulse where Off is written. When Write #3 and later not shown in the drawing are required, the waveforms similar to Write #2 are applied. The Off pulse applied before the writing of On or the On pulse applied before the writing of Off, such as shown in FIG. 7 will be referred to as a reset pulse.

The rewriting of On is carried out where the resistance variable element VR is brought to the On state imperfectly. At this time, the resistance variable element VR is first reset to the Off state, and the writing of On is executed anew (FIG. 7A). The rewriting of Off is executed where the resistance variable element VR is brought to the Off state imperfectly. At this time, the resistance variable element VR is first reset to the On state, and the writing of Off is executed anew (FIG. 7B). In the ReRAM, the failure in writing is often caused by contingency in writing operation every time without being caused by permanent deviation of the characteristics of the resistance variable element VR at which the failure in writing occurs. Therefore, the present method to re-challenge the writing after resetting of the resistor without performing overwriting becomes effective. According to the present method, the On and Off pulses identical substantially in number are applied to the resistance variable element VR even if the verify writing is repeated. Thus, the accumulation of the fatigue of the resistance variable element VR is relaxed and the reliability of the memory cell is improved.

The reset pulse can be made exactly equal to the pulse for writing On or Off. That is, the reset pulse having the Off potential in FIG. 7A can be made identical in magnitude (pulse height indicative of the magnitude of a potential and pulse width indicative of the magnitude of a period) to the pulse having the Off potential in FIG. 7B. The reset pulse having the On potential in FIG. 7B can be made identical in magnitude to the pulse having the On potential in FIG. 7A. Thus, a circuit for generating the reset pulse can be shared as the circuit for generating the normal On or Off pulse.

<Modification of Memory Cell Array>

Figure 8:
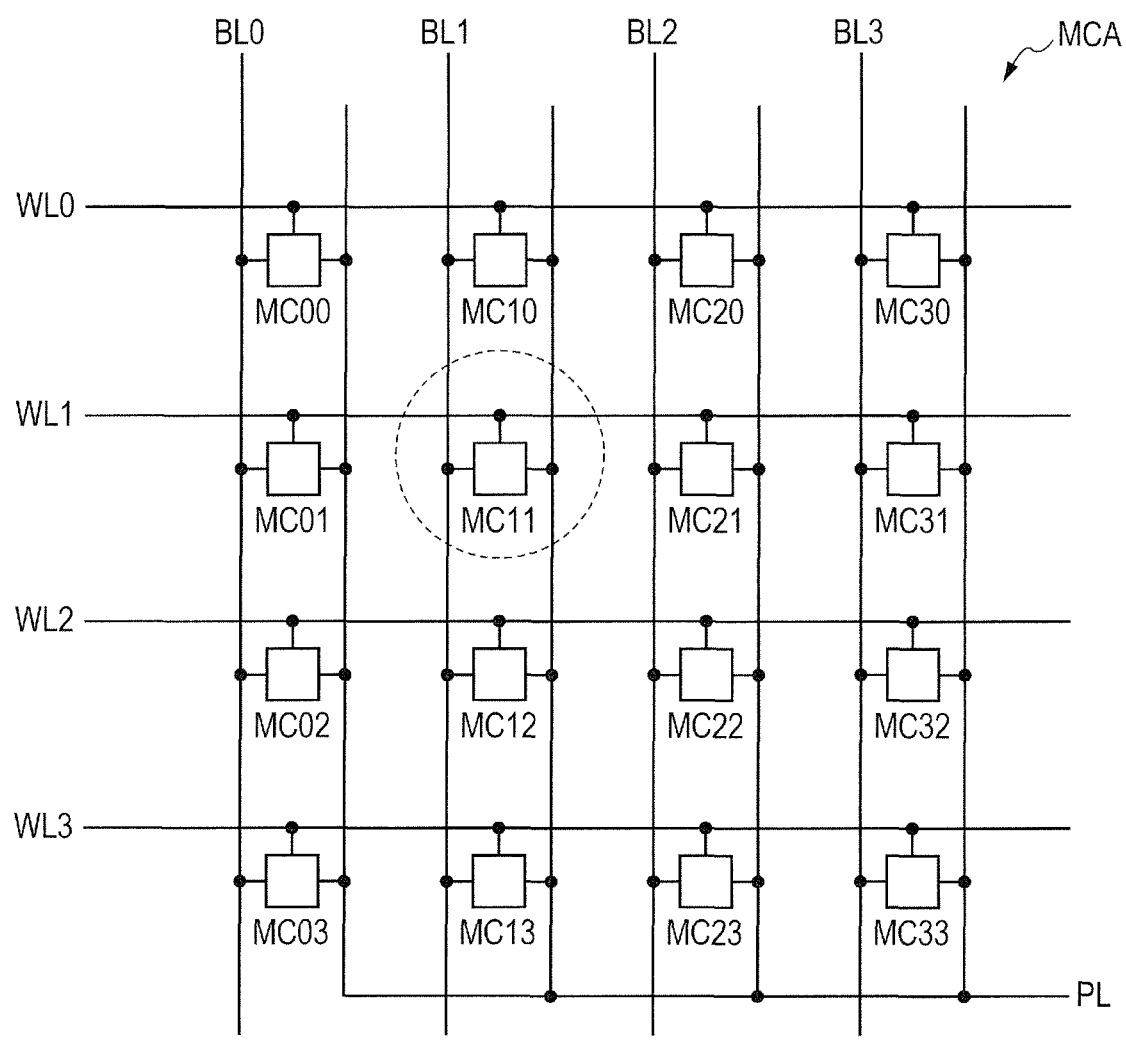
FIG. 8 is a diagram showing a modification of the configuration of the memory cell array in the semiconductor memory device according to the embodiment 1 of the present invention.

A modification of the above-described memory cell array MCA will be described with reference to FIG. 8. FIG. 8 is a diagram showing the modification of the configuration of this memory cell array.

Various deformations are considered as the forms of the memory cell array MCA. FIG. 8 is one example thereof. A plurality of plate lines PL are bundled. In other words, the plate lines PL have one ends electrically coupled in common. Thus, there is shown a configuration in which the area occupied by the memory cell array MCA can be reduced.

In this configuration, for example, in the case of writing at which a memory cell MC11 surrounded by a dotted line is brought into an On state, bit lines BL0, BL2 and BL3 may respectively be brought to a high potential in addition to the plate lines PL and a word line WL1, and all word lines WL0, WL2 and WL3 other than the word line WL1, and a bit line BL1 may respectively be brought to a zero potential. In the case of writing at which the memory cell MC11 surrounded by the dotted line is brought to an Off state, the bit line BL1 and the word line WL1 may respectively be brought to a high potential, and the plate lines PL, the bit lines BL0, BL2 and BL3, and the word lines WL0, WL2 and WL3 may respectively be brought to the zero potential. Further, in order to read whether the memory cell MC11 surrounded by the dotted line is On or Off, the current flowing through the plate lines PL and the bit line BL1 may be detected by setting the word line WL1 as a high potential, setting the word lines WL0, WL2 and WL3 other than the word line WL1, and the bit line BL1 as the zero potential, and applying a voltage sufficiently lower than at writing to the plate lines PL and the bit lines BL0, BL2 and BL3.

In the above operation, transistors are brought into non-conduction in the memory cells coupled to those other than the word line WL1 so that no voltage is applied to the resistance variable elements. Further, since the bit lines BL0, BL2 and BL3 and the plate lines PL become the same potential in each memory cell uncoupled to the bit line BL1, no voltage is applied to the resistance variable elements. Thus, only the memory cell MC11 surrounded by the dotted line is written or read. Writing to or reading from other memory cells MC00 to MC03, MC10, MC12, MC13, MC20 to MC23, and MC30 to MC33 other than the memory cell MC11 are also similar to the above.

Advantageous Effects of Embodiment 1

According to the present embodiment 1 described above, the long-term reliability of the resistance variable element VR can be improved. That is, in the bipolar type ReRAM, when the writing in one direction is continued, the deviation of the oxygen distribution in the resistance variable layer VRL occurs, and the characteristics of the resistance variable element VR fluctuate. Therefore, in the present embodiment, the Off or On writing of inverse data is first performed on the bit at which the failure in the On or Off writing is confirmed. Next, the On or Off writing of the original data is performed. Thus, in each resistance variable element VR, the deviation of the oxygen distribution in the resistance variable layer VRL can be prevented by bringing the number of times of On writing and the number of times of Off writing to the state of being always substantially equal to each other. In other words, the accumulation of fatigue of each resistance variable element VR can be relaxed by bringing the number of times of On writing and the number of times of Off writing to the state of being always substantially equal to each other. As a result, the long-term reliability of the resistance variable element VR can be relaxed. More details are as follows:

(1) When the On (or Off) writing operation fails, a rewriting operation for executing the reset Off (or On) writing operation and the original On (or Off) writing operation is performed to bring the number of times of On writing and the number of times of Off writing to the state of being always substantially equal to each other in each resistance variable element VR, thereby making it possible to prevent the deviation of the oxygen distribution in the resistance variable layer VRL.

(2) The reset Off (or On) writing operation which belongs to the rewriting operation can sufficiently obtain the effect of reducing the fatigue of the resistance variable element VR by applying the pulse of the same magnitude as in the original Off (or On) writing operation.

(3) Data is read after the On (or Off) writing operation. As a result, when the On (or Off) writing operation fails, the original On (or Off) writing operation is performed after execution of the reset Off (or On) writing operation to reset the halfway state caused by contingency in writing operation every time, so that the writing operation can be executed anew.

(4) The rewriting operation is repeated until the writing operation is successfully executed, or is repeated by a predetermined number of times to thereby make it possible to prevent falling into an endless loop where the writing operation does not succeed.

(5) Upon executing the On (or Off) writing operation, the data is read in advance, and the writing operation is performed based on the result of reading, thereby causing no deterioration of reliability. That is, when it is desired to perform the On (or Off) writing operation, the On (or Off) writing operation is executed if the Off (or On) writing operation is in an executed state, and the On (or Off) writing operation is not executed if the On (or Off) writing operation is in an executed state. Thus, the writing operation can be executed only when it is necessary to invert the state of On or Off writing.

(6) Since the plate lines PL coupled to the memory cells MC have one ends respectively electrically coupled in common, the area occupied by the memory cell array MCA can be reduced.

Embodiment 2

A semiconductor memory device according to the present embodiment 2 will be described using FIGS. 9 to 16. In the present embodiment 2, points different from the embodiment 1 will principally be described.

Since the potential settings of the plate line PL and the bit line BL are different in terms of reading, On writing and Off writing in the ReRAM, the charging and discharging of the bit line BL or the plate line PL occurs when switching these operations, and their frequency switching leads to an increase in power consumption. Although the writing to the single bit has been described in the embodiment 1, there is a case where it is desired to perform writing on a plurality of bits one after another. In such a case, the number of times of potential switching between the bit line BL and the plate line PL is reduced to make it possible to improve power consumption and an operating speed. That is, when the same operation is applied to the bits, the switching of the potential between the bit line BL and the plate line PL can be avoided by executing their operations one after another.

Figure 9:
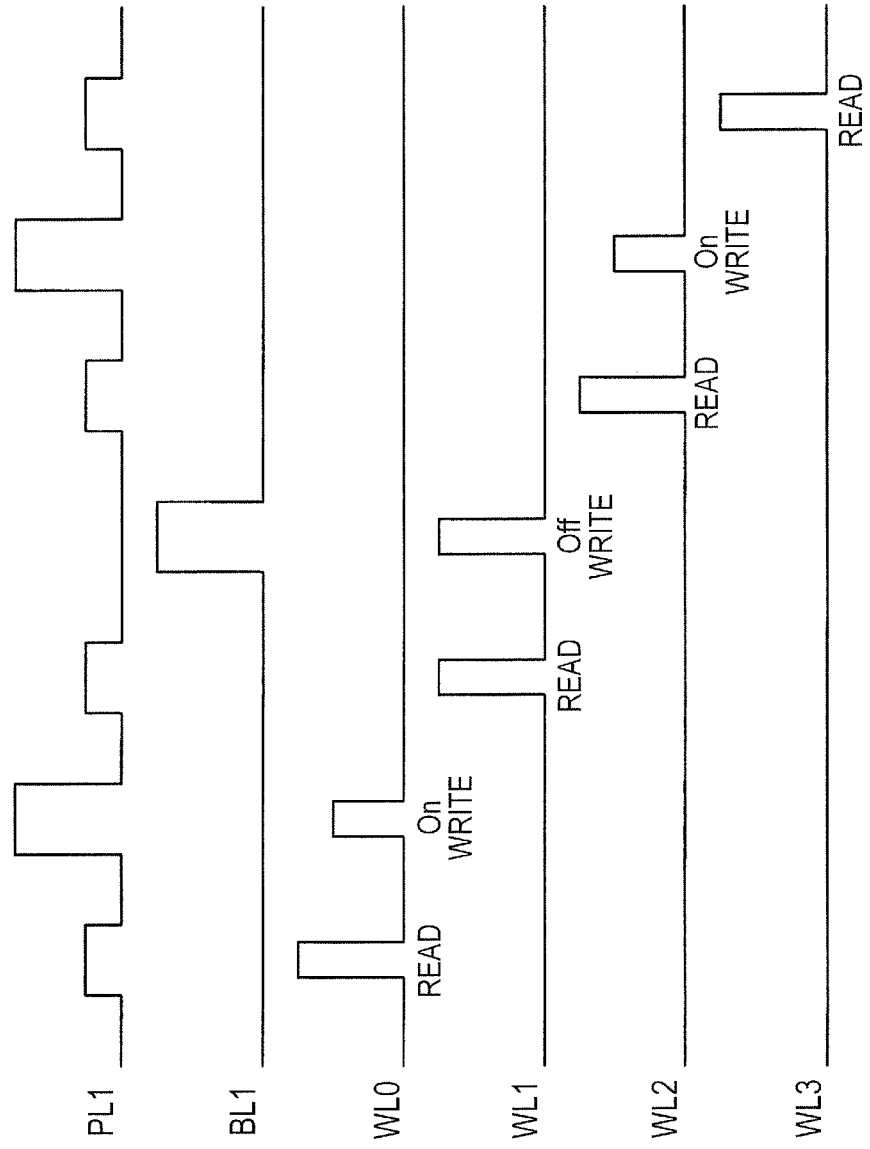
FIG. 9 is a diagram showing one example of the waveforms of a bitwise sequential writing operation in a semiconductor memory device according to an embodiment 2 of the present invention.
Figure 10:
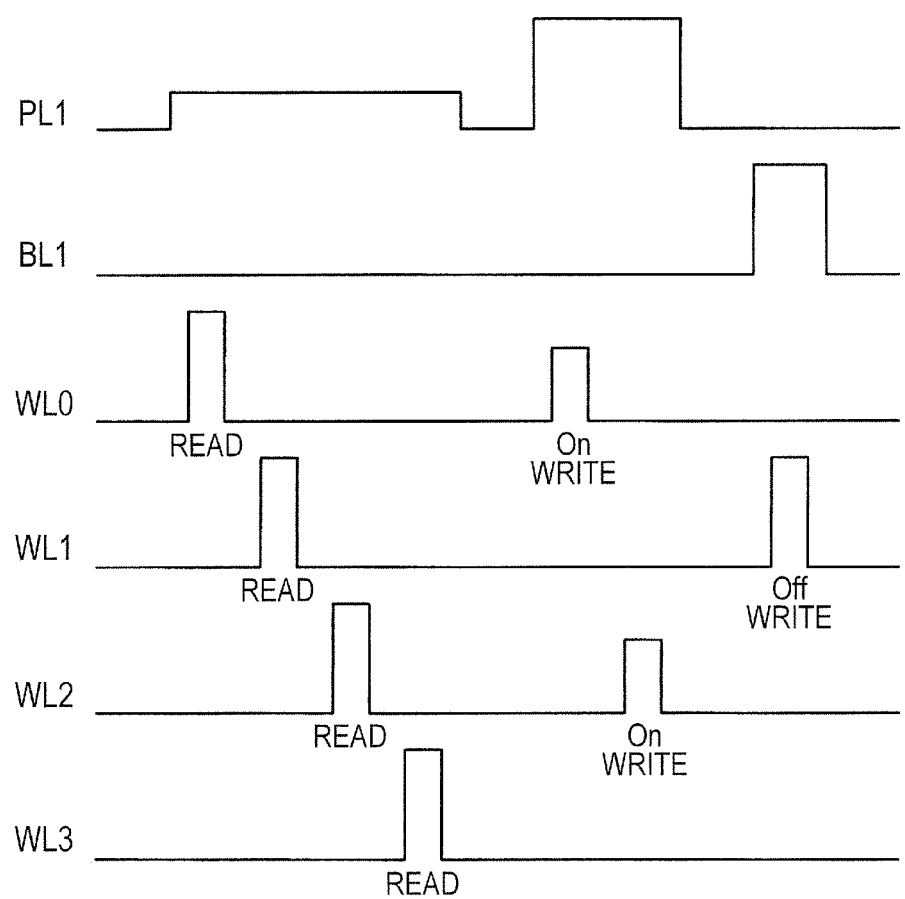
FIG. 10 is a diagram showing one example of the waveforms of a writing operation in a batch of plural bits in the semiconductor memory device according to the embodiment 2 of the present invention.

The reason why such an advantageous effect is obtained will be described by being illustrated in FIGS. 9 and 10. FIG. 9 is a diagram showing one example of the waveforms of a bitwise sequential writing operation. FIG. 10 is a diagram showing one example of the waveforms (where plural bits belong to the same bit line BL/plate line PL) of a writing operation in a batch of the plural bits. For example, consider where in FIG. 3 described above, it is desired to write data into all of four bits (memory cells MC10, MC11, MC12, and MC13) coupled to the bit line BL1 and the plate line PL1. For simplification of explanation, a similar method of thinking is applicable regardless of the presence or absence of the verify operation although the verify operation is not included.

Assume that Off, On, Off, and Off have originally been written into these four bits (addresses are assumed to be 10, 11, 12, and 13), and it is desired to write On, Off, On, and Off into these bits. On the other hand, when the operation of FIG. 5 described above is performed for each bit and a failure in writing does not occur at all, there is a need to perform, as shown in FIG. 9, the operation of "read the bit 10 (WL0)→write On into the bit 10→read the bit 11 (WL1)→write Off into the bit 11→read the bit 12 (WL2) →write On into the bit 12→read the bit 13 (WL3)→do nothing". During this operation, the potentials of the plate line PL1 and the bit line BL1 are required to be changed seven times in total like "read state→On write state→read state→Off write state→read state→On write state→read state".

However, collectively processing the four bits assumes such a procedure as shown in FIG. 10. That is, the same result can be obtained by the procedure of "read the bit 10→read the bit 11→read the bit 12→read the bit 13 (read all four bits)→write On into the bit 10→write On into the bit 12 (write On into all bits that require On writing)→write Off into the bit 11 (write Off into all bits that require Off writing)". In this case, the potentials of the plate line PL1 and the bit line BL1 require only three changes of "read state→On write state→Off write state".

Incidentally, the period of application of a pulse voltage to the resistance variable element VR is controlled so as to be determined by a period during which a write line voltage is set as a high potential. Therefore, as shown in FIGS. 9 and 10, the pulse widths of the plate line PL1 and the bit line BL1 are set widely inclusive of pulse width portions of the word lines with respect to the pulse widths of the word lines WL0, WL1, WL2, and WL3. Further, here, the high potentials of the word lines WL0, WL1, WL2, and WL3 are set such that with respect to a read pulse, an On write pulse is taken to be a low potential and an Off write pulse is taken to be an equal potential.

Figure 11A:
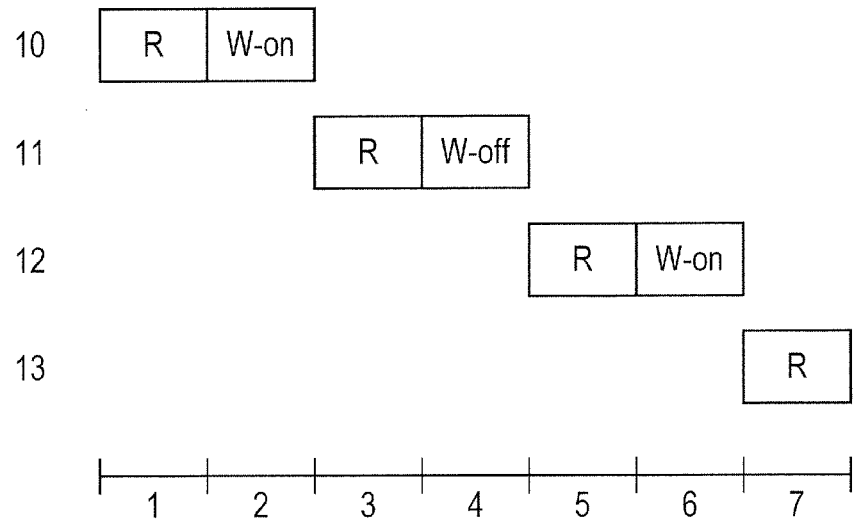
FIGS. 11A and 11B are respectively diagrams for describing one example of a sequential and efficient writing operation (free of verify) in the semiconductor memory device according to the embodiment 2 of the present invention.
Figure 11B:
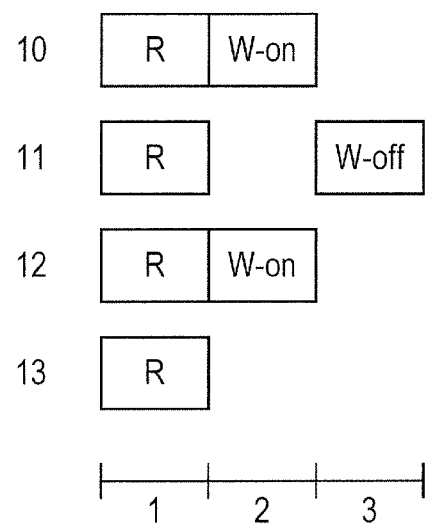

The operations of FIGS. 9 and 10 can be typically represented as shown in FIG. 11. FIG. 11 is a diagram for describing one example of a sequential and efficient writing operation (free of verify). FIG. 11A corresponds to FIG. 9, and FIG. 11B corresponds to FIG. 10. The scales in the horizontal direction respectively correspond to the voltage states of one plate line PL1 and one bit line BL1. The quadrangles shown above the scales indicate that the operations (R: reading, W-on: On writing, W-off: Off writing) of individual bits (10, 11, 12, and 13) are done. When a plurality of quadrangles are vertically arranged within the same scale, they indicate that the operations thereof are executed one after another without changing the voltage states of the plate line PL1 and the bit line BL1. FIG. 11A indicates that the operations are completed by seven changes in voltage state, and FIG. 11B indicates that the operations are completed by three changes in voltage state.

Figure 12:
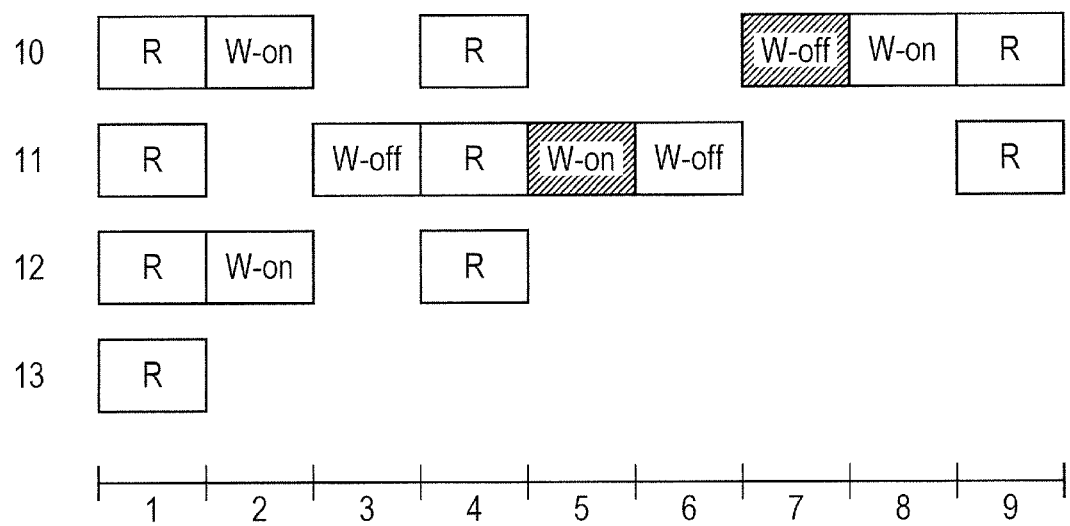
FIG. 12 is a diagram for describing one example of an efficient writing operation (including verify) in the semiconductor memory device according to the embodiment 2 of the present invention.

Further, consider where verify using a reset operation is performed. The verify reading is executed with respect to the bits 10, 11 and 12 having required writing, while holding the voltage settings of the plate line PL1 and the bit line BL1. An operation where writing to the bits 10 and 11 has failed is as shown in FIG. 12 as an example. FIG. 12 is a diagram for describing one example of an efficient writing operation (including verify). Quadrangles diagonally shaded in FIG. 12 correspond to reset writing (W-on, W-off). The verify reading of plural bits can be executed without changing the voltage states of the plate line PL1 and the bit line BL1.

That is, as shown in FIG. 12, after the fourth and subsequent times, there is shown a procedure of "read the bit 10→read the bit 11→read the bit 12 (read all of 3 bits) →write On of reset writing into the bit 11→write Off into the bit 11→write Off of reset writing into the bit 10→write On into the bit 10→read the bit 10→read the bit 11 (read 2 bits of failure in writing)".

Figure 13:
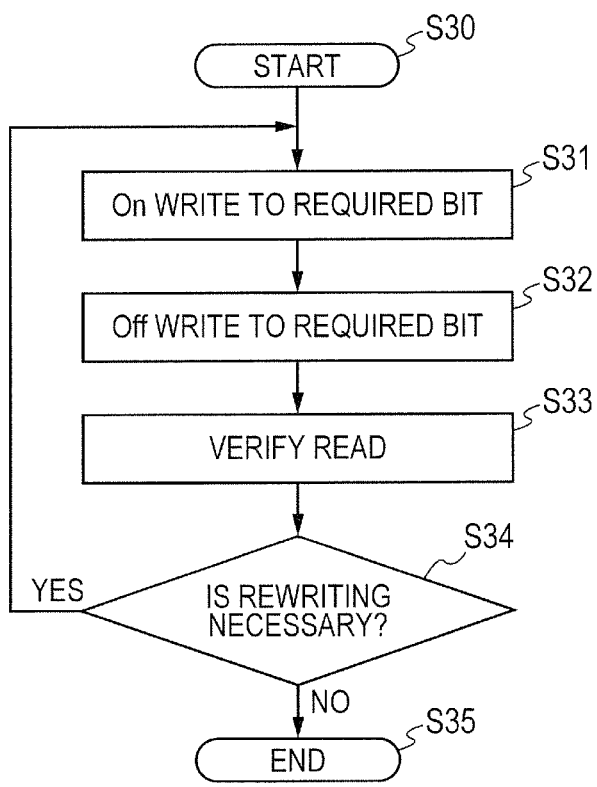
FIG. 13 is a flowchart showing one example of a verify-included writing operation (corresponding to FIG. 4) in a batch of plural bits in the semiconductor memory device according to the embodiment 2 of the present invention.
Figure 14:
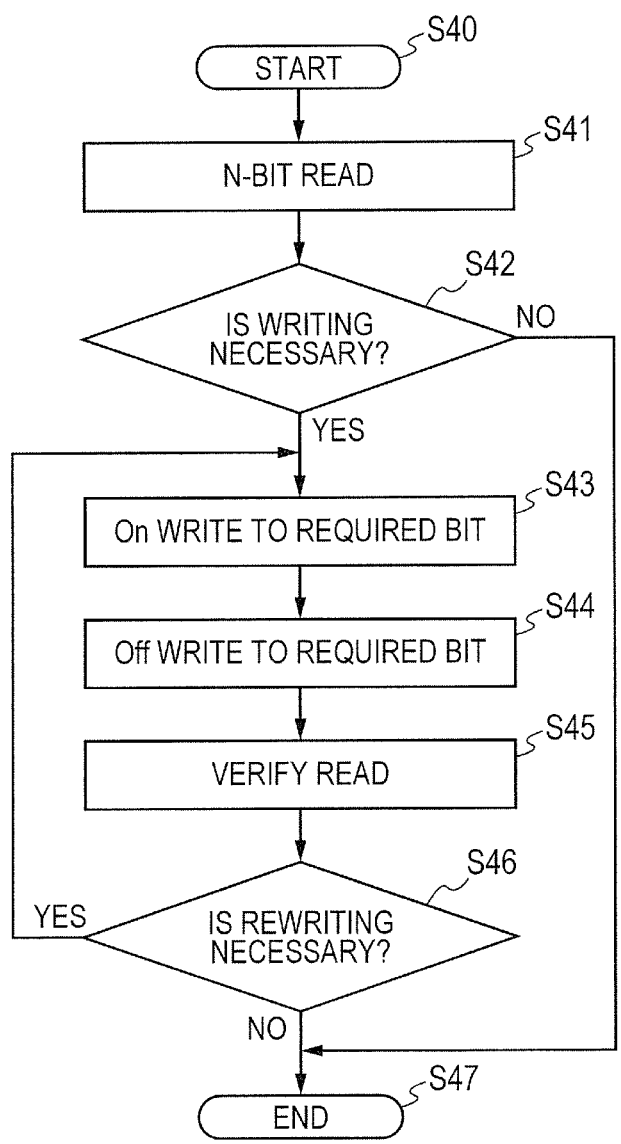
FIG. 14 is a flowchart showing one example of a verify-included writing operation (corresponding to FIG. 5) in a batch of plural bits in the semiconductor memory device according to the embodiment 2 of the present invention.

Flowcharts corresponding to the aforementioned FIGS. 4 and 5, in such a case where the bits are collectively written are illustrated as in FIGS. 13 and 14. FIG. 13 is a flowchart showing one example of a verify-included writing operation (corresponding to FIG. 4) in a batch of plural bits. FIG. 14 is a flowchart showing one example of a verify-included writing operation (corresponding to FIG. 5) in a batch of plural bits.

As shown in FIG. 13, On writing is first performed on a memory cell of a required bit in Step S31 after starting the writing operation (Step S30). Next, in Step S32, Off writing is performed on the memory cell of the required bit. Next, in Step S33, it is checked whether the writing can properly be done by performing reading of the memory cell. If the writing is determined not to be able to be done properly, it is determined that rewriting is required (Step S34—YES). Referring back to Step S31 from Step S34, the same writing operation is performed again. If it is determined that the writing can be done properly (Step S34—No), then the writing operation is ended (Step S35).

In the example of FIG. 14, reading of a desired N-bit memory cell is performed in advance in Step S41 after starting the writing operation (Step S40). Next, in Step S42, it is determined whether writing for inverting the state of the memory cell is necessary. If the writing is found to be required (Step S42—YES), writing is performed on the desired memory cell in a manner similar to FIG. 13 in Steps S43-S46. If the writing is found not to be required (Step S42—No), the writing operation is terminated (Step S47).

Figure 15:
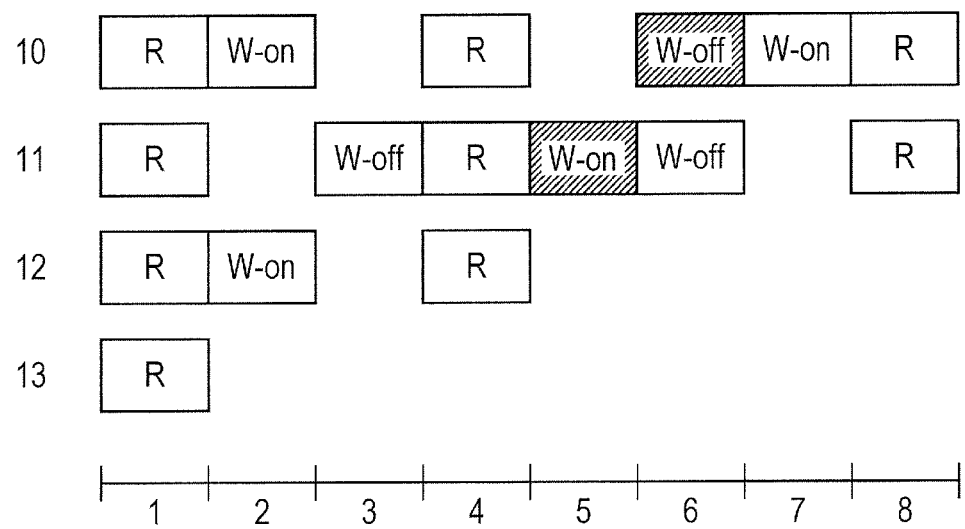
FIG. 15 is a diagram for describing a modification (in which reset writing and rewriting for verify are executed in parallel) of the efficient writing operation in the semiconductor memory device according to the embodiment 2 of the present invention.

An example in which the above-described operation of FIG. 12 is further made efficient is illustrated in FIG. 15. FIG. 15 is a diagram for describing a modification (in which verify reset writing and rewriting are executed in parallel) of an efficient writing operation. As shown in FIG. 15, at the sixth time, Off writing (W-off) in a reset operation at the bit 10, and Off writing (W-off) after the reset operation (W-on) at the bit 11 are carried out without changing the voltage states of the plate line PL1 and the bit line BL1, whereby the verify operation can further be made efficient.

Figure 16:
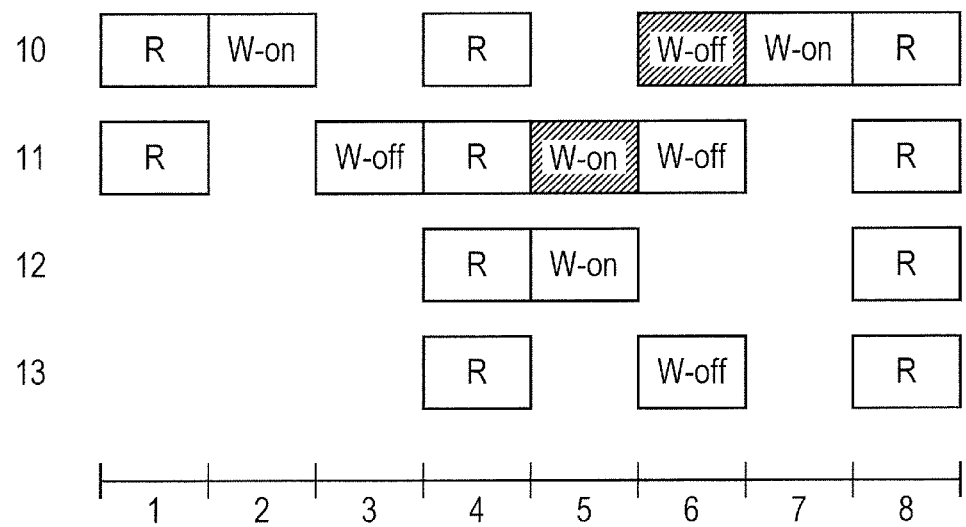
FIG. 16 is a diagram for describing a modification (in which verify and normal writing are executed in parallel) of the efficient writing operation in the semiconductor memory device according to the embodiment 2 of the present invention.

Further, FIG. 16 is a diagram for describing a modification (in which verify and normal writing are executed in parallel) of an efficient writing operation. FIG. 16 shows an example in which while writing of the bits 10 and 11 fails once and verify is done, writing of the bits 12 and 13 is carried out without waiting for the completion of verify. There is a case where when writing to a certain bit is performed and writing is next performed on another bit, it is not necessarily required to wait for the next writing until the previous writing is completed. In this case, as shown in FIG. 16, the verify operation for the previous writing, and the normal writing operation not intended for the post-writing verify can be executed in parallel.

For example, in FIG. 16, as in the sixth time, Off writing (W-off) in a reset operation at the bit 10, Off writing (W-off) for rewriting at the bit 11, and normal Off writing (W-off) at the bit 13 are executed without changing the voltage states of the plate line PL1 and the bit line BL1. Alternatively, as in the fifth time, On writing (W-on) in a reset operation at the bit 11, and normal On writing (W-on) at the bit 12 are executed without changing the voltage states of the plate line PL1 and the bit line BL1. Thus, the verify operation can be made further efficient by executing the Off writing for the reset operation or rewriting and the normal Off writing, or the On writing for the reset operation or rewriting and the normal On writing without changing the voltage states of the plate line PL1 and the bit line BL1.

In the above description, On and Off may all be replaced. Further, although there is shown in the above description, the example in which the writing and reading are not simultaneously performed on the two or more bits at the same moment, the writing and reading may be simultaneously performed on the two or more bits at the same moment if restrictions on power consumption or the like allow.

Even in the present embodiment 2 described above, an advantageous effect similar to the embodiment 1 can be obtained. In addition to this, according to the present embodiment 2, when it is desired to perform writing on the plural bits one after another, the number of times of potential switching between the bit lines BL and the plate lines PL can be reduced in avoidance of the potential switching between the bit lines BL and the plate lines PL. As a result, it is possible to improve power consumption and the operating speed. More details are as follows:

(11) By applying a reset operation belonging to a rewriting operation to a memory cell of a certain bit and applying a rewriting operation or a normal writing operation to a memory cell of another bit, while the potential between the bit line BL and the plate line PL is kept constant, an efficient writing operation can be executed in parallel. It is also possible to improve power consumption and the operating speed by reducing the number of times of potential switching between the bit lines BL and the plate lines PL.

(12) In the case of the rewriting operation, data of memory cells of plural bits can be read at one time by collectively reading the data of the memory cells of the plural bits after a writing operation and performing a writing operation on the basis of the result of their reading. It is therefore possible to perform a more efficient operation. When the write operation fails, a rewriting operation can be performed on a memory cell of a bit having failed in writing operation after a reset operation is performed on the memory cell of the bit having failed in writing operation.

(13) A writing operation to plural bits can be performed at one time by collectively performing a reset operation performed on a memory cell of a bit having failed in writing operation, and a rewriting operation or a normal writing operation performed on a memory cell of a bit different from the bit having failed in writing operation. It is therefore possible to perform a more efficient operation.

Embodiment 3

A semiconductor memory device according to the present embodiment 3 will be described using FIG. 17. In the present embodiment 3, points different from the embodiments 1 and 2 will principally be described.

Although the embodiment 2 has described the example in which the writing to and reading from each memory cell belonging to the same bit line BL are made efficient, the writing to and reading from each memory cell belonging to the same word line WL can also be made efficient by a similar way of thinking. As illustrated in FIGS. 9 and 10 described above, the On writing, the Off writing and the reading may differ in terms of the optimum voltage applied to the word line WL. In this case, it is efficient to collectively perform the On writing, the Off writing and the reading on the plural bits, respectively.

Figure 17:
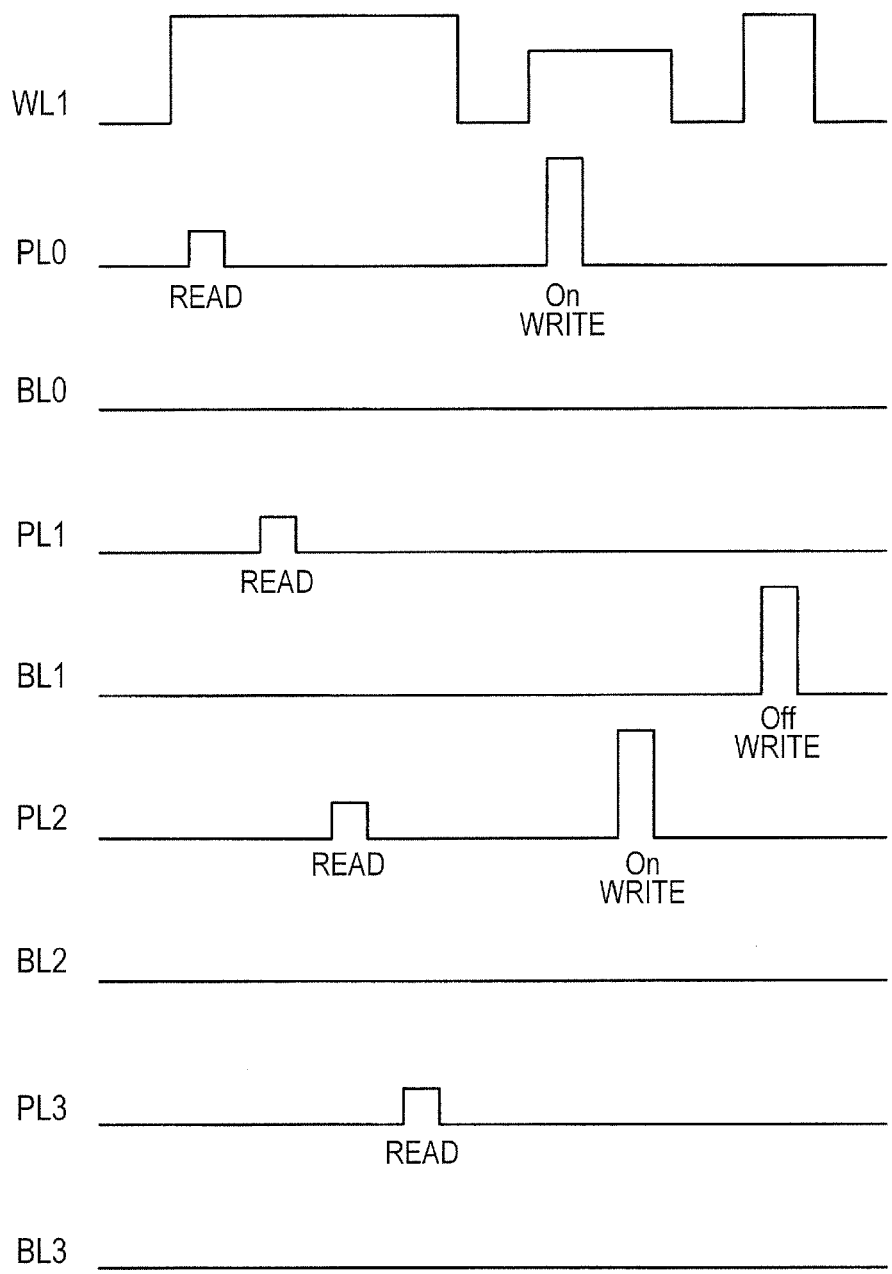
FIG. 17 is a diagram showing one example of the waveforms of a writing operation in a batch of plural bits in a semiconductor memory device according to an embodiment 3 of the present invention.

FIG. 17 is a diagram showing one example of the waveforms (where plural bits belong to the same word line WL) of a writing operation in a batch of the plural bits. In FIG. 17, Off, On, Off, and Off are originally written in four bits coupled to the word line WL1. An example of the waveforms of voltages to be applied where On, Off, On, and Off are written into these bits is shown in FIG. 17.

Although the number of times of switching of the plate lines PL or the bit lines BL is reduced in FIG. 10 described above, the number of times of switching of the word lines WL is reduced in FIG. 17. Although the width of the pulse applied to the resistance variable element VR is determined by the width of the voltage of the word line WL in FIG. 10 described above, the width of the pulse applied to the resistance variable element VR is determined by the width of the voltage of the plate line PL or the bit line BL in FIG. 17.

For example, consider where it is desired to write data into all of the four bits (memory cells MC01, MC11, MC21, and MC31) coupled to the word line WL1 in FIG. 3 described above. Such a procedure as shown in FIG. 17 is used for these four bits (addresses are assumed to be 01, 11, 21, and 31). There is shown a procedure of "read the bit 01 (PL0)→read the bit 11 (PL1)→read the bit 21 (PL2)→read the bit 31 (PL3) (read all four bits)→write On into the bit 01

(PL0)→write On into the bit 21 (PL2) (write On into all bits that require On writing)→write Off into the bit 11 (BL1) (write Off into all bits that require Off writing)". In this case, the potential of the word line WL1 may assume three changes like "read state→On write state→Off write state" in a manner similar to FIG. 10 described above.

The above method can further be combined with verify with a reset operation as with the above-described embodiment 2, and hence the descriptions in FIGS. 12 to 16 described above are established as they are. The embodiment 3 is however different from the embodiment 2 in that the reading and writing are performed on each memory cell belonging to the same bit line BL and plate line PL one after another (they may be performed simultaneously) in the embodiment 2, whereas in the present embodiment 3, the reading and writing are performed on each memory cell that belongs to the same word line WL one after another (they may be performed simultaneously).

Even in the present embodiment 3 described above, an advantageous effect similar to the embodiment 1 can be obtained. In addition to this, according to the present embodiment 3 while the number of times of voltage switching between the plate line PL and the bit line BL can be suppressed in the embodiment 2, the number of times of voltage switching of each word line WL can be suppressed. More details are as follows:

(21) By applying a reset operation belonging to a rewriting operation to a memory cell of a certain bit and applying a rewriting operation or a normal writing operation to a memory cell of another bit, while the potential of the word line WL is kept constant, an efficient writing operation can be executed in parallel. It is also possible to improve power consumption and an operating speed by reducing the number of times of voltage switching of the word line WL.

Embodiment 4

Figure 18:
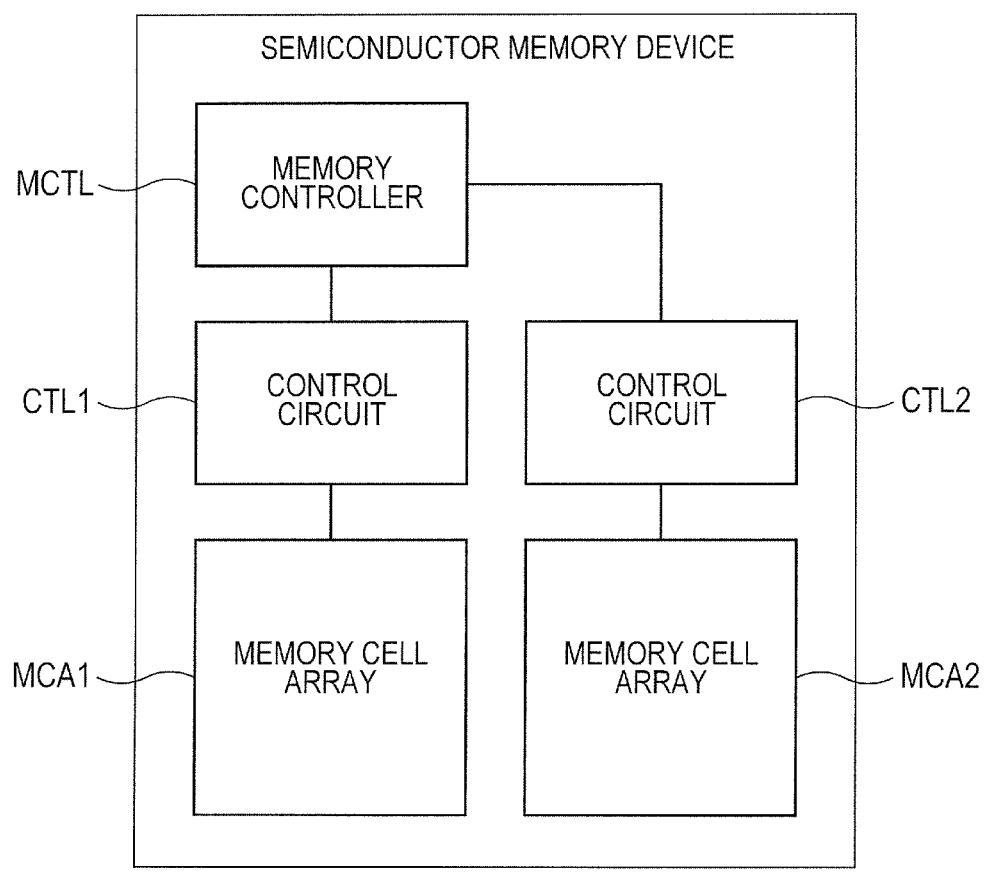
FIG. 18 is a diagram showing one example of a configuration of a semiconductor memory device according to an embodiment 4 of the present invention.

A semiconductor memory device according to the present embodiment 4 will be described using FIG. 18. FIG. 18 is a diagram showing one example of the configuration of the semiconductor memory device.

The semiconductor memory device according to the present embodiment 4 has a plurality of memory cell arrays MCA1 and MCA2, a plurality of control circuits CTL1 and CTL2 which respectively control the memory cell arrays MCA1 and MCA2, and a memory controller MCTL which controls the control circuits CTL1 and CTL2. Although the memory cell array and the control circuit are respectively illustrated as two in FIG. 18, they may be increased in number or may be one in reverse. The memory cell arrays MCA1 and MCA2 are respectively configured by arranging memory cells in a matrix form as illustrated in FIGS. 3 and 8 described above. As shown in FIG. 3 described above, the control circuits CTL1 and CTL2 respectively control the voltages applied to the plate lines, the bit lines, and the word lines at the peripheral portions of the memory cell array. The memory controller MCTL is operated by, for example, a microprogram and performs the entire control of the semiconductor memory device.

Although the embodiment 1 has described the example in which all plate lines, bit lines and word lines in the memory cell array are coupled to the control circuits (plate line control circuit PLCTL, bit line control circuit BLCTL, word line control circuit WLCTL) at the peripheral portion of the array, such a configuration as shown in FIG. 18 is also possible. For example, in order to efficiently realize the writing operation in the batch of the plural bits, which has been described in each of the embodiments 2 and 3, the semiconductor memory device may be mounted with the memory controller MCTL operated by the microprogram as shown in FIG. 18. Further, the semiconductor memory device may be mounted not only with one memory cell array, but also with the memory cell arrays MCA1 and MCA2 and the control circuits CTL1 and CTL2 which control the memory cell arrays MCA1 and MCA2, as shown in FIG. 18.

According to the present embodiment 4 described above, an advantageous effect similar to each of the embodiments 1 to 3 can be obtained. In addition to this, the operation of the semiconductor memory device can efficiently be realized by being mounted with the memory controller MCTL as in the present embodiment 4. Further, the number of respective components such as the memory cell arrays and the control circuits in the semiconductor memory device, etc. can be changed if required.

Although the invention made above by the present inventors has been described specifically on the basis of the preferred embodiments, the present invention is not limited to the embodiments referred to above. It is needless to say that various changes can be made thereto within the scope not departing from the gist thereof.

For example, the embodiments have been described in detail to make it easy to understand the present invention, but is not necessarily limited to one provided with all configurations described above. Also, part of the configuration of a certain embodiment can be replaced with the configuration of another embodiment. Further, the configuration of another embodiment can also be added to the configuration of the certain embodiment. Furthermore, addition, deletion and replacement of other configurations can be done to part of the configuration of each embodiment.

What is claimed is:

1. A semiconductor memory device, comprising:
   at least one memory cell using a resistance variable element; and
   a control circuit which controls writing to and reading from the memory cell,
   the semiconductor memory device having as operations to be done by the control circuit:
   a first writing operation for applying a first voltage of a first polarity to the memory cell,
   a second writing operation for applying a second voltage of a second polarity opposite to the first polarity to the memory cell, and
   a rewriting operation for, when the first writing operation fails, further executing a second A writing operation for applying the second voltage of the second polarity to the memory cell and a first A writing operation for applying the first voltage of the first polarity to the memory cell.

2. The semiconductor memory device according to claim 1,
   wherein the second A writing operation which belongs to the rewriting operation applies a pulse having the same magnitude as in the second writing operation.

3. The semiconductor memory device according to claim 1,
   wherein the memory cell comprises a plural, and the memory cells are respectively coupled to word lines, bit lines, and plate lines, and
   wherein while a potential between each of the bit lines and each of the plate lines is kept constant, the second A writing operation belonging to the rewriting operation is applied to a memory cell of a first bit, and the second writing operation is applied to a memory cell of a second bit.

4. The semiconductor memory device according to claim 1,
wherein the memory cell comprises a plural, and the memory cells are respectively coupled to word lines, bit lines, and plate lines, and
wherein while a potential of each of the word lines is kept constant, the second A writing operation which belongs to the rewriting operation is applied to a memory cell of a first bit, and the second writing operation is applied to a memory cell of a second bit.

5. The semiconductor memory device according to claim 1,
wherein the rewriting operation reads data of the memory cell after the first writing operation and when the first writing operation fails as a result of the data reading, performs the second A writing operation for applying the second voltage of the second polarity to the memory cell, and thereafter performs the first A writing operation for applying the first voltage of the first polarity to the memory cell.

6. The semiconductor memory device according to claim 5,
wherein the rewriting operation reads the data of the memory cell after the first A writing operation and is repeated until the first A writing operation is succeeded or repeated by a predetermined number of times as a result of the data reading.

7. The semiconductor memory device according to claim 5,
wherein the memory cell comprises a plural, and
wherein the rewriting operation collectively reads data of memory cells of plural bits after the first writing operation and when the first writing operation fails as a result of the data reading, performs the second A writing operation for applying the second voltage of the second polarity to a memory cell of a bit having failed in the first writing operation, and thereafter performs the first A writing operation for applying the first voltage of the first polarity to the memory cell of the bit.

8. The semiconductor memory device according to claim 7,
wherein the second A writing operation for applying the second voltage of the second polarity to the memory cell of the failed bit, and the second writing operation for applying the second voltage of the second polarity to a memory cell of a bit different from the failed bit are collectively performed.

9. The semiconductor memory device according to claim 1,
wherein when the first writing operation or the second writing operation is performed, the data of the memory cell is read in advance,
wherein when it is desired to perform the first writing operation as a result of the data reading, the first writing operation is executed in the case of a state in which the second writing operation is performed, and the first writing operation is not executed in the case of a state in which the first writing operation is performed, and
wherein when it is desired to perform the second writing operation as the result of the data reading, the second writing operation is executed in the case of the state in which the first writing operation is performed, and the second writing operation is not executed in the case of the state in which the second writing operation is performed.

10. The semiconductor memory device according to claim 1,
wherein the memory cell comprises a plural, and the memory cells are respectively coupled to word lines, bit lines, and plate lines, and
wherein the plate lines have one ends electrically coupled in common.

11. The semiconductor memory device according to claim 1,
wherein the memory cell comprises a plural, and
wherein the memory cells respectively have the resistance variable element and a selection transistor controlled in such a manner that the polarity of a voltage applied to the resistance variable element becomes inverse where the resistance variable element is switched to a high resistance and switched to a low resistance.

12. The semiconductor memory device according to claim 1,
wherein the memory cell comprises a plural, and the memory cells are respectively coupled to word lines, bit lines, and plate lines, and
wherein when writing to and reading from the memory cells are performed, the control circuit includes a word line control circuit which applies a voltage to each of the word lines, a bit line control circuit which applies a voltage to each of the bit lines, and a plate line control circuit which applies a voltage to each of the plate lines.

13. The semiconductor memory device according to claim 1, which has one or plural memory cell arrays in which the memory cells are arranged in a matrix form, one or plural control circuits which control the one or plural memory cell arrays, and a memory controller which controls the one or plural control circuits and is operated by a microprogram.

14. A semiconductor memory device comprising:
at least one memory cell; and
a control circuit which controls writing to and reading from the memory cell,
the control circuit reading data of the memory cell after a first writing operation for applying a first voltage of a first polarity to the memory cell, and when the first writing operation fails as a result of the data reading, performs a second A writing operation for applying a second voltage of a second polarity opposite to the first polarity to the memory cell, and thereafter performs a first A writing operation for applying the first voltage of the first polarity to the memory cell.

15. The semiconductor memory device according to claim 14,
wherein the semiconductor memory device is a ReRAM, and
wherein a selection transistor of the memory cell is a bipolar type.

* * * * *